(12) United States Patent
Asano et al.

(10) Patent No.: US 6,787,871 B2
(45) Date of Patent: Sep. 7, 2004

(54) INTEGRATED SCHOTTKY BARRIER DIODE AND MANUFACTURING METHOD THEREOF

(75) Inventors: Tetsuro Asano, Oizumi-machi (JP); Katsuaki Onoda, Ota (JP); Yoshibumi Nakajima, Ashikaga (JP); Shigeyuki Murai, Oizumi-machi (JP); Hisaaki Tominaga, Oizumi-machi (JP); Koichi Hirata, Ashikaga (JP); Mikito Sakakibara, Menuma-machi (JP); Hidetoshi Ishihara, Oizumi-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/283,331

(22) Filed: Oct. 30, 2002

(65) Prior Publication Data

US 2003/0094668 A1 May 22, 2003

(30) Foreign Application Priority Data

Oct. 31, 2001 (JP) .................................... 2001-334087

(51) Int. Cl.[7] .......................... H01L 27/095; H01L 29/47
(52) U.S. Cl. .................. 257/471; 257/449; 257/478; 257/472; 257/483; 257/484; 257/473; 257/476; 257/480; 257/485

(58) Field of Search ................... 257/471, 449, 257/478, 472, 483, 484, 473, 476, 480, 485; 438/572, 571

(56) References Cited

U.S. PATENT DOCUMENTS

| 4,254,428 A | * | 3/1981 | Feth et al. | 357/15 |
| 6,627,967 B2 | * | 9/2003 | Asano et al. | 257/472 |

* cited by examiner

Primary Examiner—Jerome Jackson
Assistant Examiner—Joseph Nguyen
(74) Attorney, Agent, or Firm—Morrison & Foerster LLP

(57) ABSTRACT

An integrated Schottky barrier diode chip includes a compound semiconductor substrate, a plurality of Schottky barrier diodes formed on the substrate and an insulating region formed on the substrate by an on implantation. The insulating region electrically separates a portion of a diode at a cathode voltage from a portion of the diode at an anode voltage. Because of the absence of a polyimide layer and trench structures, this planar device configuration results in simpler manufacturing method and improved device characteristics.

7 Claims, 6 Drawing Sheets

FIG.1A

Prior Art

FIG.1B

Prior Art

FIG.2

Prior Art

INTEGRATED SCHOTTKY BARRIER DIODE AND MANUFACTURING METHOD THEREOF

BACKGROUND OF THE INVENTION

1. Field of the Invention

This invention relates to an integrated Schottky barrier diode chip made of a compound semiconductor for use in a high frequency circuit, specifically to an integrated Schottky barrier diode chip that includes an insulating region electrically separating portions of a diode of the chip, and a manufacturing method thereof.

2. Description of the Related Art

The demand for high frequency devices has been increasing in recent years because of the worldwide expansion of the portable telephone market as well as the increased demand for digital satellite receiving/sending equipment. Many of these devices utilize a field effect transistor (FET) made of a compound semiconductor, such as gallium arsenide (GaAs), which is suitable for use in a high frequency range. Typical example of such devices include a monolithic microwave integrated circuit (MMIC) that integrates the FETs, a local oscillation FET and a GaAs-based Schottky barrier diode that is used for sending/receiving station in wireless communication.

Figure 1A:
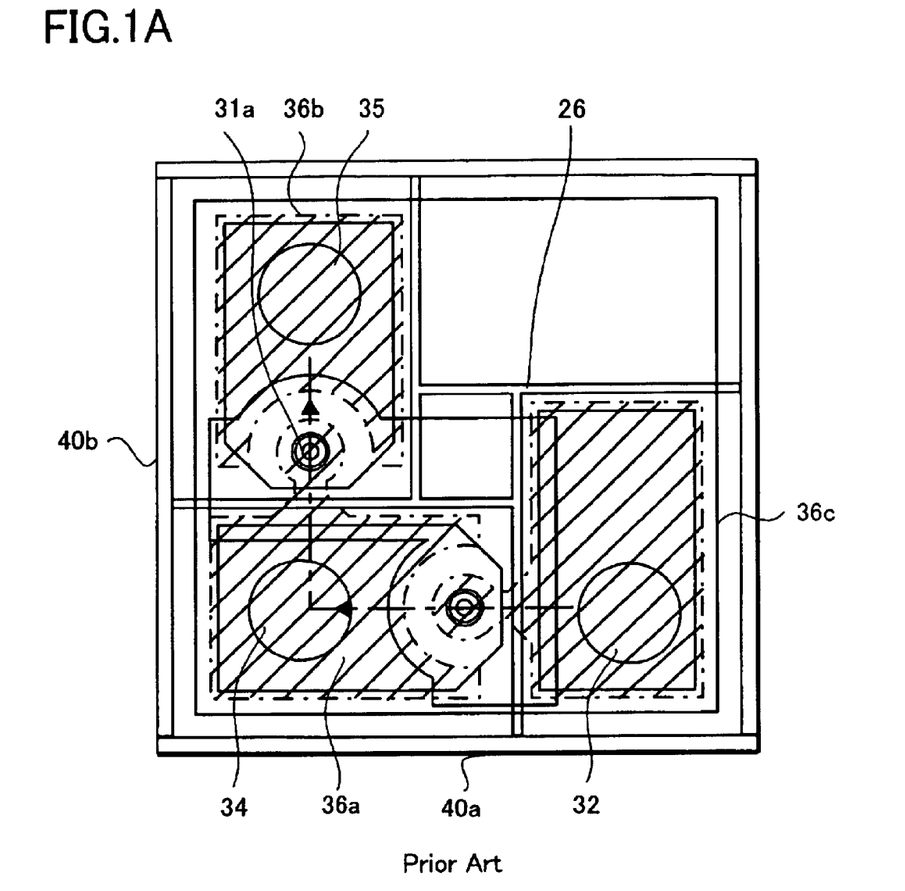
FIG. 1A is a plan view of a conventional integrated Schottky barrier diode chip with two diodes.
Figure 1B:
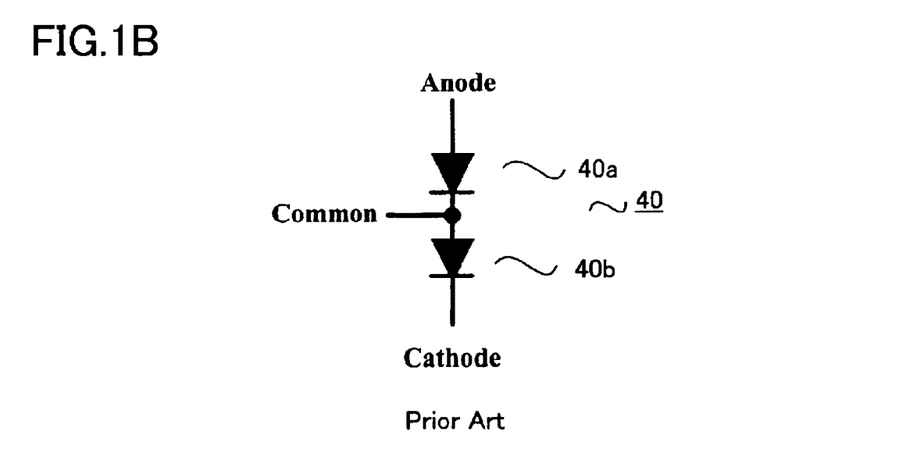
FIG. 1B is an equivalent circuit of the device of FIG. 1A.

FIG. 1A is a plan view of a conventional integrated Schottky barrier diode chip, and FIG. 1B is its equivalent circuit. This type of integrated Schottky barrier diode is referred to as a Tee type, and has two Schottky barrier diodes 40a, 40b integrated in a chip. This chip also has a common electrode 36a and its related terminal 34, a cathode electrode 36b and its related terminal 35, and an anode electrode 36c and its related terminal 32. These electrodes 36a, 36b, 36c are indicated by the areas encircled by unevenly broken lines in the figure.

The two Schottky barrier diodes 40a, 40b share the common electrode 36a. In other words, the common electrode 36a serves as a cathode electrode of the Schottky barrier diode 40a, the anode of which is the anode electrode 36c, and serves as an anode of the Schottky barrier diode 40b, the cathode of which is the cathode electrode 36b. The terminals are the areas of the corresponding electrodes that are used for external connection. Typically, those are the areas for wire bonding, and indicated by the circles in FIG. 1A.

This configuration provides a circuit shown in FIG. 1B. Namely, the cathode of the Schottky barrier diode 40a, the anode of which is the anode terminal 32, is connected to the anode of the Schottky barrier diode 40b, the cathode of which is the cathode terminal 35.

Figure 2:
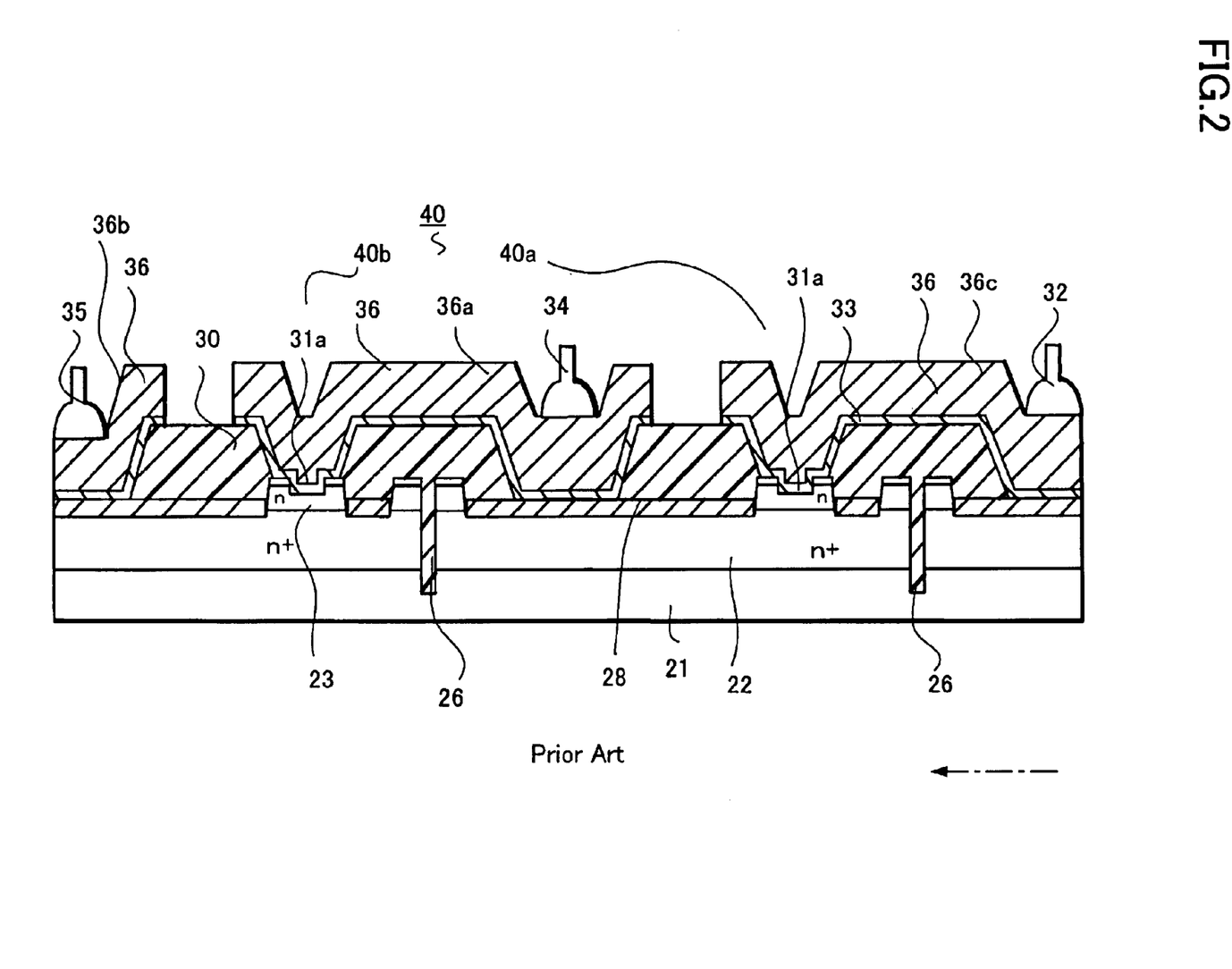
FIG. 2 is a cross-sectional view of the conventional device of FIG. 1A cut along the arrow shown in FIG. 1A.

FIG. 2 is a cross-sectional view of the integrated Schottky barrier diode chip of FIG. 1A. This cross-section is along the arrow in FIG. 1 and intersects operation areas of the two diodes. An n+ epitaxial layer 22 ($Si^+ 5 \times 10^{18}$ $cm^{-3}$) is disposed on an undoped GaAs substrate 21 and has a thickness of about 6 $\mu$m. An n epitaxial layer 23 ($Si^+ 1.3 \times 10^{17}$ $cm^{-3}$) is disposed on the n+ epitaxial layer 22 and has a thickness of about 350 nm. This n epitaxial layer 23 serves as an operation layer of the Schottky barrier diodes. An ohmic electrode 28 is a disposed directly on the n+ epitaxial layer 22 and forms an ohmic contact with the n+ epitaxial layer 22. This first metal layer is made of a AuGe/Ni/Au composite metal layer. A second metal layer 33, made of Ti/Pt/Au composite layer, forms a Schottky contact with the n epitaxial layer 23 in a Schottky contact region 31a of the anode portion of the diode, and forms a contact with the ohmic electrode 28 in the cathode portion of the diode. A third metal layer 36 is a Au metal layer, which is formed by plating using the second metal layer 33 as a base electrode, and completely covers the second metal layer 33. Portions 36a, 36b, 36c of the third metal layer 36 serve as the common electrode 36a, the cathode electrode 36b and the anode electrode 36c, respectively.

The Schottky contact region 31a has a circular shape with a diameter of about 10 $\mu$m, as shown in FIG. 1. The first metal layer 28 surrounds the Schottky contact region 31a. The first and second metal layers are formed by vapor depositing the constituent metals separately. In the terminal areas 32, 34, 35 of the corresponding electrodes 36c, 36a, 36b, a lead wire is bonded to the electrode surface as shown by reference numerals 32, 34 and 35 in FIG. 2.

In the configuration of FIG. 2, the Schottky barrier diode on the left 40b has the cathode electrode 36b, which serves a cathode of this left diode and the common electrode 36a, which serves as an anode of this left diode, and the Schottky barrier diode on the right 40a has the anode electrode 36c, which serves an anode of this right diode and the common electrode 36a, which serves as a cathode of this right diode. Accordingly, the common electrode 36a works as an anode electrode of the diode 40b and a cathode electrode of the diode 40a. Furthermore, the second metal layer 33 on the Schottky contact regions 31a is at an anode voltage, and the n+ and n epitaxial layers are at a cathode voltage. In this structure, a polyimide layer 30 is required as an insulating layer under the second and third metal layers 33, 36, which are at the anode voltage, at locations in which the metal layers 33, 36 intersect the portions of the epitaxial layers 22, 23, which are at the cathode voltage. The thickness of the polyimide layer 30 needs to be as much as 6–7 $\mu$m because this intersection area is large and the resultant parasitic capacitance must be reduced by increasing the thickness. Polyimide is used as the insulating layer because it has a low dielectric constant and suitable for a thick layer formation.

Furthermore, this configuration needs a trench 26 that separates the portions of the epitaxial layers 22, 23, which are at the cathode voltage, from the portions of the epitaxial layers 22, 23, which are at the anode voltage. This is an inevitable requirement when more than two diodes are formed in one chip. The trenches 26 reach the undoped gallium arsenide substrate 21, and are filled with the same polyimide used for the polyimide layer 30. The ohmic electrode 28 needs to form a direct contact with the n+ epitaxial layer for reducing the associated electric resistance. For this reason, a mesa etching is required to expose the n+ epitaxial layer 22 that is covered by the n epitaxial layer 23. The n epitaxial layer 23 at the Schottky contact region is also required to be etched to precisely the thickness of 250 nm for good electric characteristics.

However, the Schottky barrier diode of the conventional configuration described above has a few disadvantages. First, further size reduction of the device is difficult because such a configuration needs a large positional error margin for absorbing mask misplacement during manufacturing due to the tall polyimide layer (6–7 $\mu$m) and the deep trenches (15 $\mu$m). Second, the trench structure requires an additional process step exclusively designed for trench formation, which needs to be added to a manufacturing method of a discrete device.

This invention is directed to an integrated Schottky barrier diode chip that is smaller and is fabricated by a simpler process than the conventional integrated Schottky barrier diode chip.

SUMMARY OF THE INVENTION

The invention provides an integrated Schottky barrier diode chip including a compound semiconductor substrate, an operation layer formed on the substrate, and a plurality of Schottky barrier diodes formed on the substrate. The device also includes an insulating region formed in the operation layer, which electrically separates a first portion of the operation layer of one of the plurality of Schottky barrier diodes from a second portion of the operation layer of that Schottky barrier diodes. The device further includes an impurity region formed in the operation layer, which electrically communicates with one of the first and second portions of the operation layer of that Schottky barrier diode.

The invention also provides an integrated Schottky barrier diode chip that has a first Schottky barrier diode and a second Schottky barrier diode each formed on a compound semiconductor substrate. The device includes an operation layer formed on the substrate, an anode electrode, a cathode electrode and a common electrode. A first insulating region and a first impurity region are formed in the operation layer for the first Schottky barrier diode. A second insulating region and a second impurity region are formed in the operation layer for the second Schottky barrier diode. In this configuration, the first insulating region electrically separates a portion of the operation layer of the first diode that is connected to the anode electrode from a portion of the operation layer of the first diode that is connected to the common electrode, and the second insulating region electrically separates a portion of the operation layer of the second diode that is connected to the common electrode from a portion of the operation layer of the second diode that is connected to the cathode electrode. The first impurity region electrically communicates with the operation layer of the first diode that is connected to the common electrode, and the second impurity region electrically communicates with the operation layer of the second diode that is that is connected to the cathode electrode.

The invention further provides a method of manufacturing an integrated Schottky barrier diode chip having a plurality of Schottky barrier diodes. The method includes forming a plurality of insulating regions on a compound semiconductor substrate by an ion implantation, and forming a Schottky barrier diode on each of the plurality of the insulating regions so that each of the insulating regions electrically separates a first portion of the corresponding diode from a second portion of the corresponding diode.

The invention also provides a method of manufacturing an integrated Schottky barrier diode chip having a plurality of Schottky barrier diodes. The method includes forming an epitaxial layer of a conduction type on an undoped compound semiconductor substrate, forming a plurality of insulating regions in the epitaxial layer by an ion implantation, and forming a Schottky barrier diode on each of the plurality of the insulating regions so that each of the insulating regions electrically separates a first portion of the epitaxial layer of the corresponding diode from a second portion of the epitaxial layer of the corresponding diode.

DETAILED DESCRIPTION OF THE INVENTION

Two embodiments of this invention will be described with reference to FIGS. 3–6D. Both of the embodiments include an undoped GaAs substrate 1, an anode electrode 16c, a cathode electrode 16b, a common electrode 16a, Schottky barrier diodes 20a, 20b and an insulating region 6.

Figure 3A:
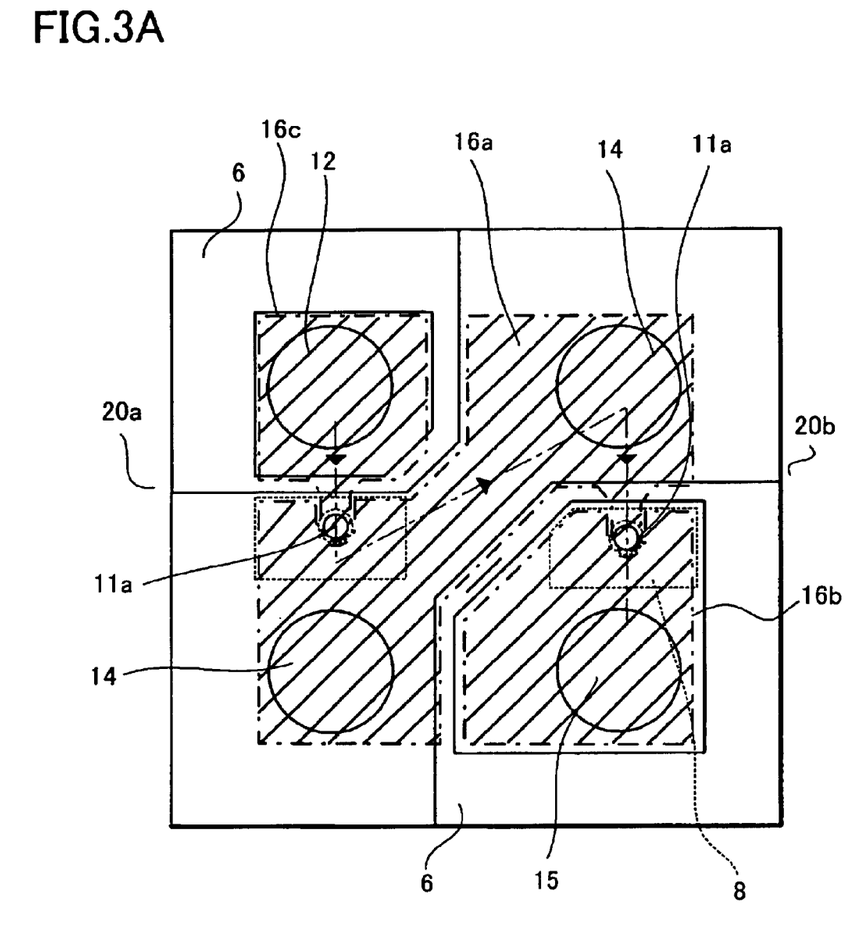
FIG. 3A is a plan view of an integrated Schottky barrier diode chip with two diodes of a first embodiment of this invention.
Figure 3B:
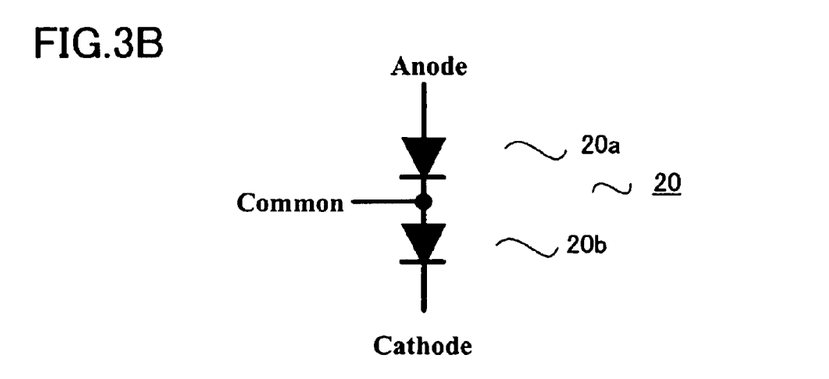
FIG. 3B is an equivalent circuit of the device of FIG. 3A.

A first embodiment of this invention is described with reference to FIGS. 3A, 3B, 4. FIG. 3A is a plan view of an integrated Schottky barrier diode chip of the first embodiment of this invention, and FIG. 3B is an equivalent circuit of the device of FIG. 3A. This integrated Schottky barrier diode is a Tee type device, and has two Schottky barrier diodes 20a, 20b integrated in a chip. This chip also has a common electrode 16a and its related terminal 14, a cathode electrode 16b and its related terminal 15, and an anode electrode 16c and its related terminal 12. These electrodes 16a, 16b, 16c are indicated by the areas encircled by unevenly broken lines in the figure.

The two Schottky barrier diodes 20a, 20b share the common electrode 16a. In other words, the common electrode 16a serves as a cathode of the Schottky barrier diode 20a, the anode of which is the anode electrode 16c, and serves as an anode of the Schottky barrier diode 20b, the cathode of which is the cathode electrode 16b. The terminals are the areas of the corresponding electrodes that are used for external connection. Typically, those are the areas for wire bonding, and indicated by the circles in FIG. 3A.

This configuration provides a circuit shown in FIG. 3B. Namely, the cathode of the Schottky barrier diode 20a, the anode of which is the anode terminal 12, is connected to the anode of the Schottky barrier diode 20b, the cathode of which is the cathode terminal 15.

Figure 4:
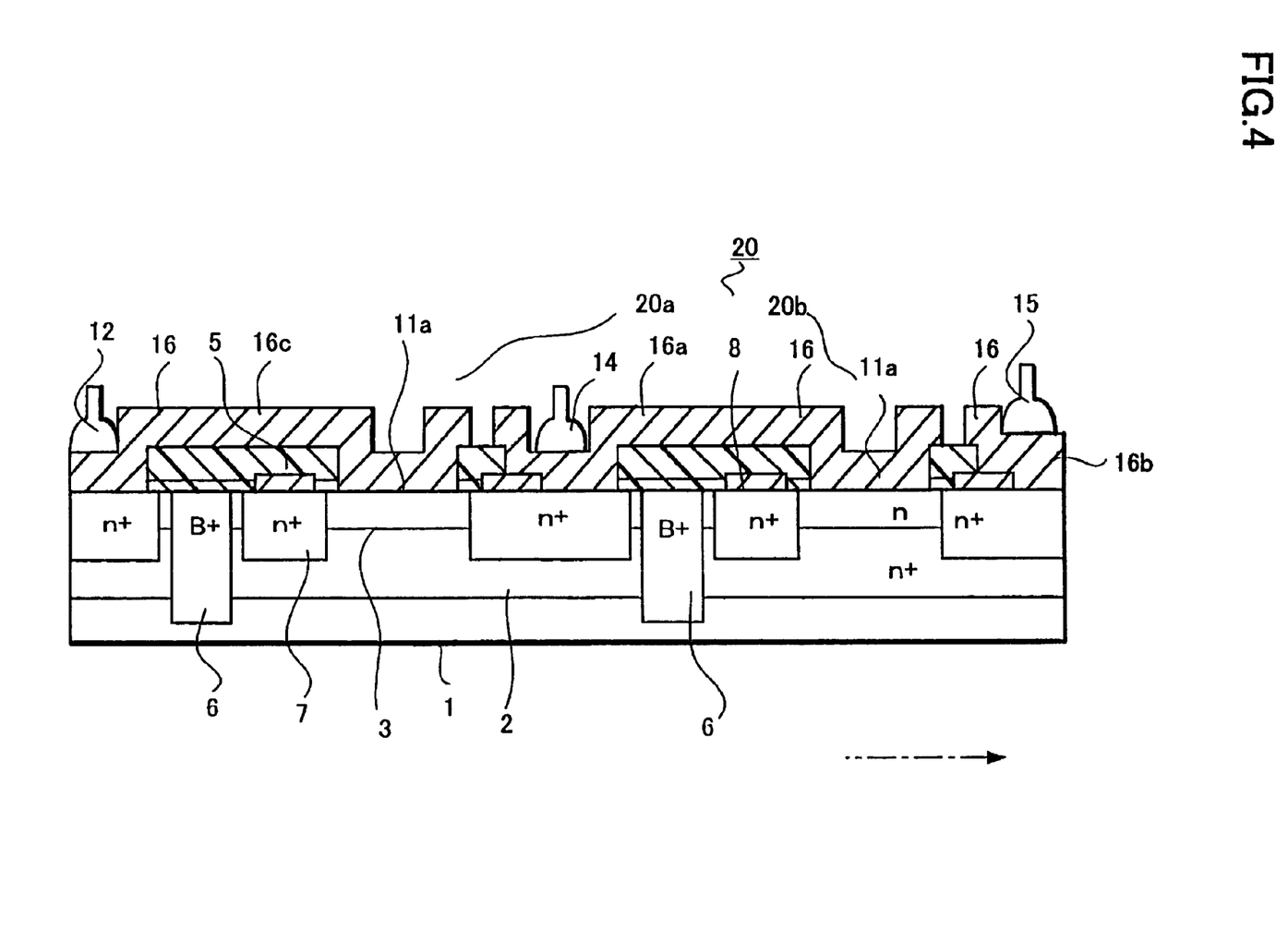
FIG. 4 is a cross-sectional view of the device of the first embodiment cut along the arrow shown in FIG. 3A.

FIG. 4 is a cross-sectional view of the integrated Schottky barrier diode chip of FIG. 3A. This cross-section is along the arrow in FIG. 3A and intersects operation areas of the two diodes. An n+ epitaxial layer 2 ($Si^+5\times10^{18}$ $cm^{-3}$) is disposed on an undoped GaAs substrate 1 and has a thickness of about 500 nm. An n epitaxial layer 3 ($Si^+1.3\times10^{17}$ $cm^{-3}$) is disposed on the n+ epitaxial layer 2 and has a thickness of about 250 nm. This n epitaxial layer 3 is an operation layer of the Schottky barrier diodes.

Impurity region 7 of a high concentration ($Si^+1\times10^{18}$ $cm^{-3}$) is formed in the n epitaxial layer 3 under an ohmic electrode 8, and reaches the n+ epitaxial layer 2. The impurity region 7 surrounds a Schottky contact region 11a, which is circular as shown in FIG. 3A, and overlaps with the ohmic electrode 8, which is indicated by the area encircled by the broken lines in FIG. 3A. In the region surrounding the Schottky contact region 11a, the impurity region 7 is larger than the ohmic electrode 8 and extends outside the area covered by the ohmic electrode 8. The distance between the edge of the Schottky contact region 11a and the edge of the impurity region 7 is about 1 $\mu$m, and the distance between the edge of the Schottky contact region 11a and the edge of the ohmic electrode 8 is about 2 $\mu$m. Because of this impurity region 7, which reaches the n+ epitaxial layer 2 form the surface of the n epitaxial layer 3, there is no need for forming a mesa structure, which is required for forming an ohmic contact with the n+ epitaxial layer in the conventional device as shown in FIG. 2. Accordingly, the device of the first embodiment has a planar configuration.

The ohmic electrode 8 is a disposed directly on the impurity region 7 and forms an ohmic contact with the n+ epitaxial layer 2 through the impurity region 7. This first metal layer is made of a AuGe/Ni/Au composite metal layer and has a hole corresponding to the Schottky contact region 11a, as shown by the broken line in FIG. 3A. A second metal layer 16, made of Ti/Pt/Au composite layer, forms a Schottky contact with the n epitaxial layer 3 in the Schottky contact region 11a of the anode portion of the diode, and forms an contact with the ohmic electrode 8 in the cathode portion of the diode. Portions 16a, 16b, 16c of second metal layer 16 serve as the common electrode 16a, the cathode electrode 16b and the anode electrode 16c, respectively.

The Schottky contact region 11a has a circular shape with a diameter of about 10 $\mu$m, as shown in FIG. 3A. The thickness (250 nm) of the n epitaxial layer 3, which is an operation layer of the Schottky barrier diode, is determined so that proper device characteristics, including a high breakdown voltage, are obtained. Because of the planar configuration of this embodiment, the thickness control of the operation layer or the mesa etching is not needed. Then the device of the first embodiment is much easier to produce and more reliable than the conventional device that requires very precise etching control of the operation layer and complicated mesa etching. Accordingly, the integrated Schottky barrier diode chip of this embodiment has improved device characteristics.

The common electrode 16a is disposed diagonally on the chip, and two areas for wire bonding are provided at both diagonal ends of the common electrode. Only one area needs to be wire-bonded for external connection and become a common terminal 14. This configuration makes it easier to mount the integrated Schottky barrier diode chip of this embodiment on a package frame, a print board or the like, because the common electrode 16a is accessible from two different directions for wire bonding.

In the configuration of FIG. 4, the Schottky barrier diode 20a on the left has the anode electrode 16c, which serves as an anode of this left diode and the common electrode 16a, which serves as a cathode of this left diode, and the Schottky diode 20b on the right has the cathode electrode 16b, which serves as a cathode of this right diode and the common electrode 16a, which serves as an anode of this right diode. Accordingly, the common electrode 16a works as a cathode electrode of the diode 20a and an anode electrode of the diode 20b. Furthermore, the second metal layer 16 on the Schottky contact regions 11a is at an anode voltage, and the n+ and n epitaxial layers are at a cathode voltage.

An insulating region 6 is formed for each of the anode and cathode electrodes 16c, 16b, and surrounds the corresponding electrodes 16c, 16b. In each of the diodes 20a, 20b, the insulating layer 6 electrically separates the portions of the n+ and n epitaxial layers 2, 3 that are at the anode voltage form the portions of the n+ and n epitaxial layers 2, 3 that are at the cathode voltage. For this purpose, each of the insulating regions 6 reaches the undoped GaAs substrate 1, which is essentially an insulating substrate. The insulating region 6 replaces the conventional trench structure of FIG. 2.

An insulating film 5, made of silicon nitride, prevents the portions of the second metal layer 16 that are at the anode voltage from contacting the portion of the n+ and n epitaxial layers and corresponding impurity regions 7 that are at the cathode voltage. This insulating film 5 replaces the conventional polyimide layer of FIG. 2. Although the silicon nitride insulating film 5 is thinner and has a higher dielectric constant than the polyimide layer of the conventional device, it can be used as an insulating layer because it occupies a smaller area than the conventional polyimide layer. In other words, in this configuration, the area of the intersection between the second metal layer 16 that is at the anode voltage and the portion of the n and n+ epitaxial layers 2, 3 and the corresponding impurity regions 6 that are at the cathode voltage are much smaller than that of the conventional device. This is made possible thanks to the smaller process error margin due to the planar configuration of this embodiment, which are free from the mesa structure and the tall polyimide insulating layer that require larger process error margin and, thus, a larger separation between the Schottky contact region and the ohmic electrode, which results in a larger area for generating parasitic capacitance.

The distance between the edge of the Schottky contact region 11a and the edge of the ohmic electrode 8 in this embodiment is 2 $\mu$m, which is much shorter than 7 $\mu$m, the corresponding distance of the conventional device. Furthermore, the distance between the edge of the Schottky region 11a and the edge of the impurity region 7 is 1 $\mu$m. Since the impurity region 7, which serves as a carrier path, has the electronic conduction properties similar to the ohmic electrode 8, the effective separation in this embodiment is about one seventh of the conventional device. This shorter separation also contributes to reduction of the electric resistance between the Schottky contact region 11a and the ohmic electrode 8/impurity region 7, and thus improvement of high frequency device characteristics.

The configuration described above does not have a deep trench or tall polyimide layer on the surface of the GaAs chip. Accordingly, the accuracy of positioning masks for patterning is improved and the large processing error margins for patterning is not required for manufacturing the integrated Schottky barrier diode chip of this invention. Furthermore, the absence of the polyimide layer removes the requirements for tapering the side of the polyimide layer and the related process error margin for the tapered side. Because of this reduction of the error margins, the chip size of this embodiment is significantly reduced. The reduced error margin also allows size reduction in the operation area of the diode, which includes the Schottky contact region 11a and the corresponding ohmic electrode 8. This, in turn, provides a more flexible device design, in which the location of the two diodes are determined based on other device design requirements. Taking advantage of this flexible design feature, the common electrode 16a is disposed diagonally on the chip in this embodiment, as described earlier.

Figure 5:
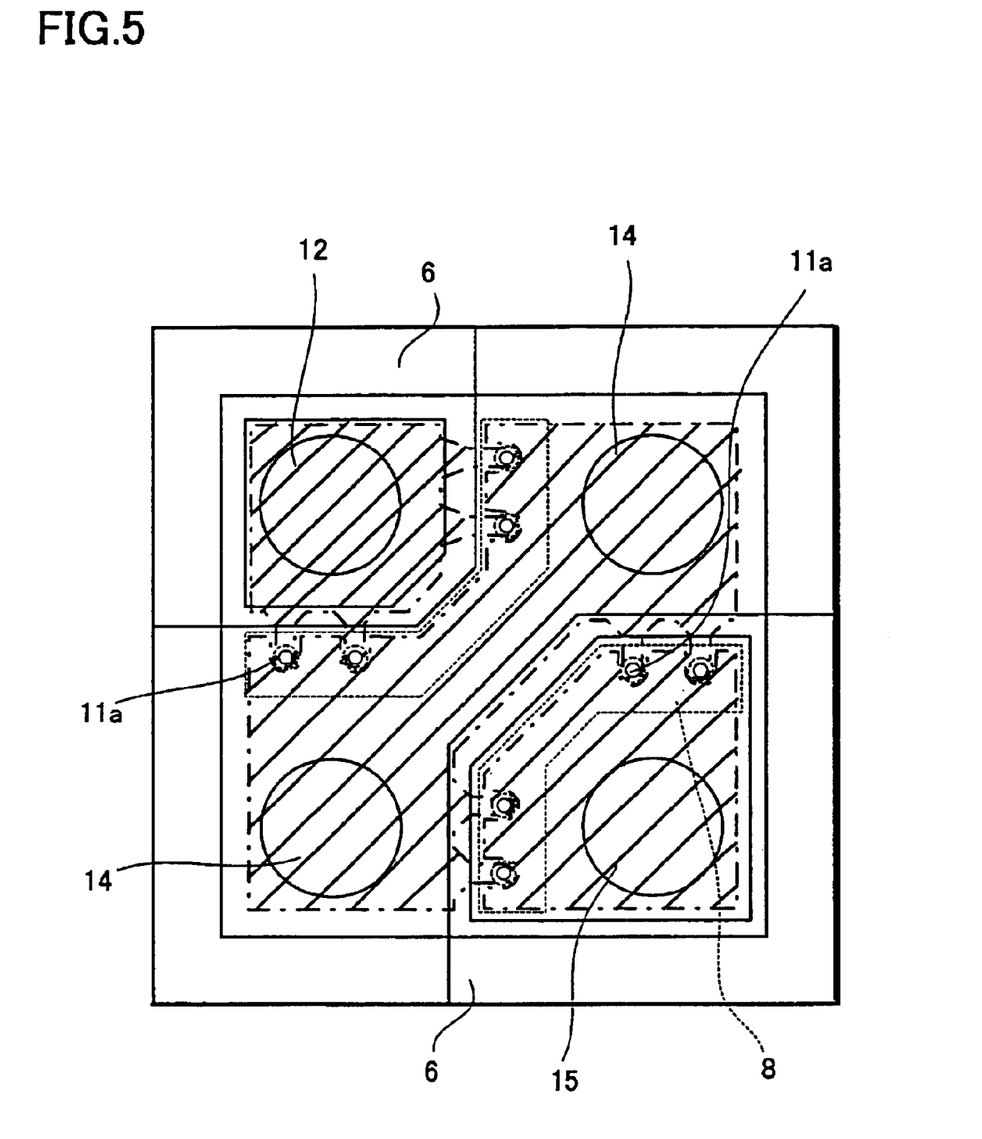
FIG. 5 is a cross-sectional view of an integrated Schottky barrier diode chip with two diodes of a second embodiment of this invention.

An integrated Schottky barrier diode chip of a second embodiment of this invention is described with reference to FIG. 5. This embodiment is similar to the first embodiment except that the second embodiment has a plurality of Schottky contact regions 11a for each of the Schottky contact barrier diodes on the chip. In the device shown in FIG. 5, each of the two diodes has four Schottky contact regions 11a connected in parallel. Because the four Schottky contact regions 11a as a whole need to have the same Schottky contact area as the one contact area of the first embodiment, each of the Schottky contact region 11a in this embodiment has a smaller size (5 $\mu$m). In this configuration, carrier trap efficiency in the impurity region 7 becomes higher because the separation between the center of the Schottky contact region 11a and the impurity region 7 is further reduced. This leads to a reduced cathode resistance and, thus, improved high frequency device characteristics.

Figure 6A:
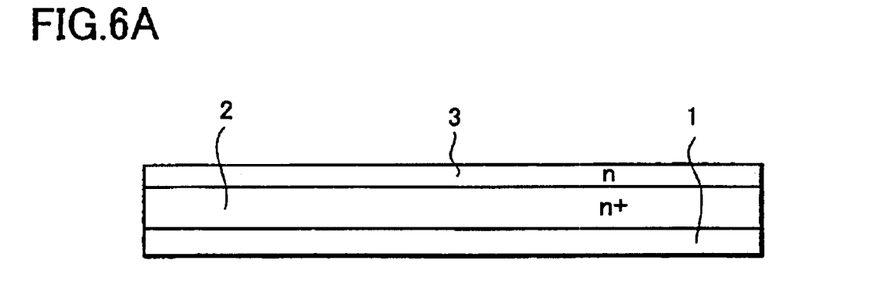
FIGS. 6A–6D show cross-sectional views of device intermediates at process steps of a manufacturing method of the integrated Schottky barrier diode chip of the first embodiment.

A manufacturing method of the device of the first embodiment will be described below with reference to FIGS. 6A–6D. First, n and n+ epitaxial layers are formed on an undoped GaAs substrate 1, as shown in FIG. 6A. The n+ epitaxial layer 2 ($Si^+ 5 \times 10^{18}$ $cm^{-3}$), which has a thickness of about 500 nm, is first formed on the undoped GaAs substrate 1 using metal-organic chemical vapor deposition (MOCVD) technique. The n epitaxial layer 3 ($Si^+ 1.3 \times 10^{17}$ $cm^{-3}$), which has a thickness of about 250 nm, is then formed on the n+ epitaxial layer using MOCVD.

Figure 6B:
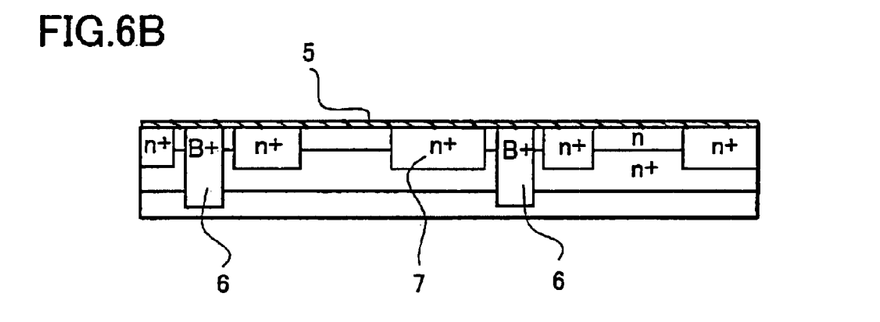

In the next process step, an insulating region 6 is formed in the n and n+ epitaxial layers by ion implantation technique, as shown in FIG. 6B. First, the entire top surface of the device intermediate of FIG. 6A is covered by a nitride film 5, and a photoresist layer (not shown) is formed on the nitride film 5. The photoresist layer is, then, exposed so that the portions of the photoresist layer that correspond to locations for formation of an insulating region 6 are removed during a subsequent developing process. After the developing of the photoresist layer, impurities such as boron ($B^+$) and hydrogen ($H^+$) are ion-implanted into the n and n+ epitaxial layers 2, 3 using the photoresist layer as a mask. The ion implantation condition, in this embodiment, is $B^+$ 160 KeV and $4 \times 10^{13}$ $cm^{-2}$. The insulating region 6 thus formed reaches the undoped GaAs substrate 1. Because the formation of the insulating region 6 does not require the trench formation of the conventional device of FIG. 2, a method of manufacturing a discrete diode device is applied to this manufacturing method without major modification.

After removal of the photoresist layer, another photoresist layer is formed on the entire device intermediate. This photoresist layer is patterned to provide openings that correspond to locations of formation of impurity regions 7. Using this photoresist layer as a mask, n type impurities are implanted into the n epitaxial layer 3 and the n+ epitaxial layer 2 to form the impurity regions 7. In this embodiment, $Si^+$ impurities are implanted to provide an impurity concentration of about $1 \times 10^{18}$ $cm^{-3}$. The ion implantation should be performed over several implantation steps with different implantation conditions so that the impurity concentration is homogeneous along the depth direction of the impurity region 7. For example, in this embodiment, the first implantation is performed under $Si^+$ 180 KeV and $1 \times 10^{14}$ $cm^{-2}$, and the second implantation is performed under $Si^+$ 30 KeV and $1 \times 10^{13}$ $cm^{-2}$. After removal of the photoresist layer, an additional nitride film 5 is formed on the nitride film 5 for annealing the impurity region 7 and the insulating region 6.

Figure 6C:
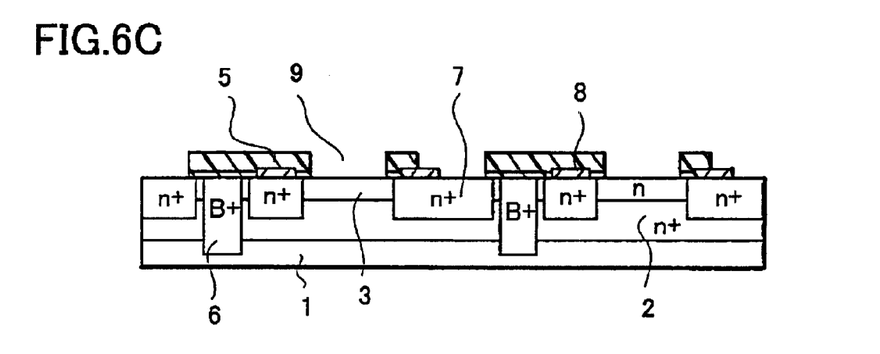

In the process step shown in FIG. 6C, an ohmic electrode 8 is formed on the impurity region 7 to form an ohmic contact with the impurity region 7. First, a photoresist layer is formed on the entire top surface of the device intermediate and is patterned to open portions of the photoresist layer that correspond to locations of formation of the ohmic electrode 8. Using the photoresist layer as a mask, the nitride film 5 that is exposed in the opening of the photoresist layer is removed to expose the impurity region 7. A first metal layer mad of AuGe/Ni/Au is deposited on the exposed surface of the impurity region 7 by vacuum-vapor depositing AuGe, Ni and Au in this order, and the photoresist layer is removed to leave the first metal layer only on the predetermined locations of the ohmic electrode 8. The device intermediate is, then, heated to alloy the first metal layer so that an ohmic contact is formed between the fist metal layer and the impurity region 7. This configuration of the impurity region 7 and the ohmic electrode 8 enables the planar structure of the integrated Schottky barrier diode chip of this embodiment.

Then, an additional nitride film 5, which has a thickness of about 500 nm, is formed on the entire device intermediate. A photoresist layer is formed on the nitride film 5 and patterned to open portions of the photoresist layer that correspond to locations of formation of Schottky contact regions 11a and the bonding pad regions. The portions of the nitride film 5, which is exposed in the opening of the photoresist layer, is removed by dry etching. After removal of the photoresist layer, a contact hole 9 emerges to expose the n epitaxial layer 3.

Figure 6D:
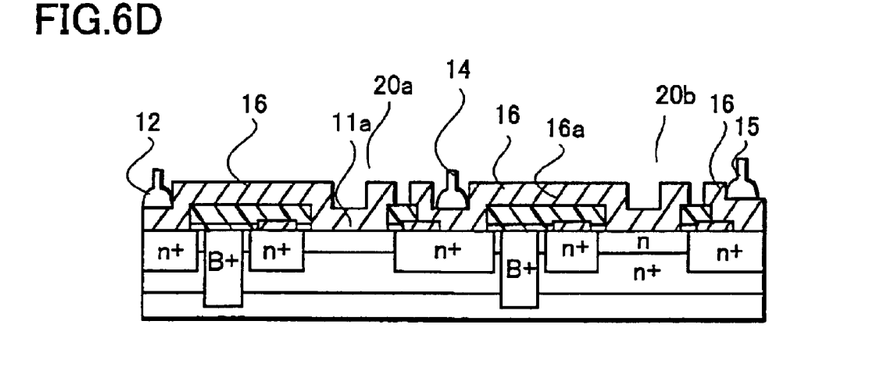

In the process step shown in FIG. 6D, a second metal layer 16 is formed to provide a common electrode 16a, an anode electrode 16c and a cathode electrode 16b. A photoresist layer is formed on the entire device intermediate and patterned to open portions of the photoresist layer that correspond to locations of formation of the electrodes 16a, 16b, 16c. The second metal layer 16 made of Ti/Pt/Au is, then, formed on the entire top surface of the device intermediate by vacuum-vapor depositing Ti, Pt and Au in this order. The photoresist layer is removed to leave the second metal layer 16 only at locations of the electrodes 16a, 16b, 16c. Accordingly, a Schottky contact is formed between the second metal layer 16 and the n epitaxial layer 3 at the anode portion of the diode, and an contact is formed between the second meal layer 16 and the ohmic electrode 8. Then, the backside of the substrate undergoes a back wrapping process.

In the conventional manufacturing method of the device shown in FIG. 1A, etching of the epitaxial layers 22, 23 and the GaAs substrate 21 is required to adjust the depth of the operation layer 23, to create the mesa structure and to create the trenches 26. Especially, the etching of the operation layer 23 is difficult to control because of the process parameters such as swing speed and swing amplitude of the device intermediate in an etching solution as well as maintenance of the etching solution. The planar configuration of the device of this embodiment removes the etching step of the epitaxial layers and the GaAs substrate, which is required in manufacturing the conventional integrated Schottky barrier diode chip. Accordingly, an integrated Schottky barrier diode chip with improved device characteristics is obtained.

Furthermore, the conventional manufacturing method need to perform a plurality of polymer coatings for forming the polyimide layer 30 and an extended plating process for forming the tall Au plating layer 36 that is required to accommodate the low mechanical strength of the polyimide layer 30. By replacing the polyimide layer with the thin nitride film and replacing the Au plating layer with the thin vapor-deposited metal layer, the manufacturing method of this embodiment is simpler and more effective than the conventional method.

Finally, the integrated Schottky barrier diode chips thus formed on the GaAs substrate are transferred to an assembly process. The GaAs wafer is diced to separate the individual chips. After the separated chips are mounted on a frame, the wire bonding regions of the electrodes are connected to corresponding leads by stitch-bonding a thin gold wire line. A resin transfer molding of the chip and the frame completes packaging of the device.

What is claimed is:

1. An integrated Schottky barrier diode chip including a first Schottky barrier diode and a second Schottky barrier diode each formed on a compound semiconductor substrate, the chip comprising:

an operation layer formed on the substrate;

an anode electrode;

a cathode electrode;

a common electrode;

a first insulating region and a first impurity region each formed in the operation layer for the first Schottky barrier diode; and a second insulating region and a second impurity region each formed in the operation layer for the second Schottky barrier diode, wherein the first insulating region electrically separates a portion of the operation layer of the first diode that is connected to the anode electrode from a portion of the operation layer of the first diode that is connected to the common electrode, and the second insulating region electrically separates a portion of the operation layer of the second diode that is connected to the common electrode from a portion of the operation layer of the second diode that is connected to the cathode electrode, and the first impurity region electrically communicates with the operation layer of the first diode that is connected to the common electrode, and the second impurity region electrically communicates with the operation layer of the second diode that is connected to the cathode electrode.

2. The integrated Schottky barrier diode chip of claim 1, wherein the common electrode serves as a cathode electrode of the first diode and an anode electrode of the second diode.

3. The integrated Schottky barrier diode chip of claim 2, wherein the common electrode is disposed diagonally on the substrate and provides two areas for wire bonding.

4. The integrated Schottky barrier diode chip of claim 1, wherein the compound semiconductor substrate is made of an undoped gallium arsenide, the operation layer comprises an epitaxial layer of a conduction type, and each of the first and second diodes comprises an ohmic electrode formed on the epitaxial layer and an electrode forming a Schottky contact with the epitaxial layer.

5. The integrated Schottky barrier diode chip of claim 4, wherein the first and second insulating regions reach the undoped gallium arsenide substrate.

6. The integrated Schottky barrier diode chip of claim 1, wherein each of the first and second diodes comprises a plurality of Schottky contact regions.

7. The integrated Schottky barrier diode chip of claim 1, wherein the first and second insulating regions are formed by an ion implantation.

* * * * *